United States Patent
Yan et al.

(10) Patent No.: US 9,831,431 B2
(45) Date of Patent: Nov. 28, 2017

(54) OLED CURVED-SURFACE DISPLAY PANEL AND MANUFACTURING METHOD THEREOF, AND DISPLAY DEVICE

(71) Applicant: BOE TECHNOLOGY GROUP CO., LTD., Beijing (CN)

(72) Inventors: Guang Yan, Beijing (CN); Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/098,482

(22) Filed: Apr. 14, 2016

(65) Prior Publication Data

US 2016/0343947 A1 Nov. 24, 2016
US 2017/0229651 A9 Aug. 10, 2017

(30) Foreign Application Priority Data

May 22, 2015 (CN) .......................... 2015 1 0268482

(51) Int. Cl.
*H01L 51/00* (2006.01)
*H04N 9/30* (2006.01)
*H01L 51/52* (2006.01)
*H01L 51/56* (2006.01)

(52) U.S. Cl.
CPC ...... *H01L 51/0023* (2013.01); *H01L 51/0096* (2013.01); *H01L 51/5203* (2013.01); *H01L 51/56* (2013.01); *H04N 9/30* (2013.01)

(58) Field of Classification Search
CPC ............. H01L 51/0545; H01L 51/0036; H01L 51/0541; H01L 51/5012
See application file for complete search history.

(56) References Cited

U.S. PATENT DOCUMENTS

| 8,975,636 B2 * | 3/2015 | Kim ..................... H01L 51/5209 257/59 |
| 9,269,753 B2 * | 2/2016 | Lee ....................... G09G 3/3291 |
| 2014/0133073 A1 | 5/2014 | Ahn et al. |

FOREIGN PATENT DOCUMENTS

| CN | 1691858 A | 11/2005 |
| CN | 102969329 A | 3/2013 |
| CN | 103996695 A | 8/2014 |
| CN | 104362257 A | 2/2015 |
| CN | 105097868 A | 11/2015 |

OTHER PUBLICATIONS

Geoffrey Morrison, CNET News—"Curved OLED HDTV screens are a bad idea (for now)", dated Jun. 18, 2013, 5 pps., printed PDF on Aug. 11, 2017, url: https://www.cnet.com/news/curved-oled-hdtv-screens-are-a-bad-idea-for-now/.
China First Office Action, Application No. 201510268482.3, dated Jun. 7, 2017, 17 pps.: with English translation.

* cited by examiner

*Primary Examiner* — Quoc Hoang
(74) *Attorney, Agent, or Firm* — Armstrong Teasdale LLP

(57) ABSTRACT

An OLED curved-surface display panel is provided. The display panel includes a second transparent electrode, an organic luminescent layer, a first transparent electrode, and a reflective electrode, wherein the second transparent electrode is closer to a display side than the first transparent electrode, and wherein a thickness of the first transparent electrode increases from a middle portion of the first transparent electrode to an edge portion of the first transparent electrode.

16 Claims, 4 Drawing Sheets

OLED CURVED-SURFACE DISPLAY PANEL AND MANUFACTURING METHOD THEREOF, AND DISPLAY DEVICE

CROSS REFERENCE TO RELATED APPLICATIONS

This application claims priority of Chinese Patent Application No. 201510268482.3, filed on May 22, 2015, the entire content of which is incorporated by reference herein.

BACKGROUND

The embodiments of the present invention relate to an OLED curved-surface display panel and a manufacturing method thereof, and a display device.

An important advantage of the curved-surface display relative to the flat display is that, generally speaking, the curved-surface display can provide a better viewing effect from one edge to the other edge, and the edge information amount of the curved-surface display is much larger than that of the flat display.

A color cast can easily occur in the top-emission curved-surface display in the case of a large viewing angle due to the characteristics of the top emission. As shown in FIG. 1, the curved-surface display in turn includes a second transparent electrode 4, an organic luminescent layer 3, a first transparent electrode 21 and a reflective electrode 1 from the display side to the inside. The edge has a large viewing angle for an observer directly facing the screen center, thus the observer will feel that there is a color difference between the middle portion and the edge portion when viewing the curved-surface display.

BRIEF DESCRIPTION

The embodiments described herein provide an OLED curved-surface display panel and a manufacturing method thereof, and a display device, which can reduce the color difference between the edge portion and the middle portion of the curved-surface display.

In a first aspect, an OLED curved-surface display panel is provided. The display panel includes a second transparent electrode, an organic luminescent layer, a first transparent electrode and a reflective electrode, wherein the second transparent electrode is closer to a display side than the first transparent electrode, and a thickness of the first transparent electrode trends to get thicker from a middle portion to an edge portion.

In one example, a variation range of the thickness from the middle portion to the edge portion of the first transparent electrode is 10 nm to 150 nm.

In one example, an increasing rate of the thickness of the first transparent electrode gradually rises from the middle portion to the edge portion.

In one example, the first transparent electrode includes a plurality of thickness areas, which are formed in a patterning process, so that the thickness area at the middle portion is thinner than the thickness area at the edge portion.

In one example, the number of columns of pixels covered by a thickness area close to the edge portion of the first transparent electrode is larger than the number of columns of pixels covered by a thickness area close to the middle portion of the first transparent electrode.

In one example, the number of rows of pixels covered by a thickness area close to the edge portion of the first transparent electrode is larger than the number of rows of pixels covered by a thickness area close to the middle portion of the first transparent electrode.

In a second aspect, a method for manufacturing an OLED curved-surface display is provided. The method includes forming a reflective electrode, a first transparent electrode, an organic luminescent layer and a second transparent electrode, wherein a thickness of the first transparent electrode trends to get thicker from a middle portion to an edge portion.

In one example, forming the first transparent electrode includes forming a first transparent electrode film, and etching the first transparent electrode film with a patterning process, so as to form a first transparent electrode including N thickness areas having different thicknesses, wherein N≥2 and is a natural number, the thickness areas each include two sub-thickness areas symmetrical with respect to a central line of the first transparent electrode film, or a thickness area at the right center includes one sub-thickness area, and other thickness areas each include two sub-thickness areas symmetrical with respect to the central line of the first transparent electrode film.

In one example, a thickness corresponding to an $i^{th}$ thickness area among the N thickness areas is $T_i$, i=1, 2, 3, ..., N, and etching the first transparent electrode film with a patterning process, so as to form the first transparent electrode including N thickness areas having different thicknesses includes:

S1: i=N;

S2: forming photoresist on a surface of the first transparent electrode film, reserving the photoresist in the $i^{th}$ to $N^{th}$ thickness areas, and etching the first transparent electrode film in other areas with the patterning process to a thickness $T_{i-1}$;

S3: if i>2, i=i−1 and repeating step S2, so that the finally formed first transparent electrode trends to get thicker from the middle portion to the edge portion, wherein $T_i > T_{i-1}$, and the $i^{th}$ thickness area is closer to the edge than the i−1$^{th}$ thickness area;

S4: removing the photoresist.

In one example, a value of N is 3.

In one example, a value of N is not more than a half of the number of columns of pixels of the display panel.

In one example, the number of columns of pixels covered by the $i^{th}$ thickness area is larger than the number of columns of pixels covered by the i−1$^{th}$ thickness area, i=1, 2, 3, ..., N.

In one example, the number of rows of pixels covered by the $i^{th}$ thickness area is larger than the number of rows of pixels covered by the i−1$^{th}$ thickness area, i=1, 2, 3, ..., N.

In a third aspect, a display device is provided. The display device includes the OLED curved-surface display panel described in the above embodiments.

The first transparent electrode of the OLED curved-surface display panel according to the embodiments described herein trends to get thicker from the middle portion to the edge portion, thereby the color difference between the edge and the middle of the curved-surface display can be reduced.

DETAILED DESCRIPTION

Next, example embodiments of the disclosure will be further described in details in combination with the drawings. The following embodiments are adopted to explain the disclosure, rather than limiting the scope thereof.

Figure 1:
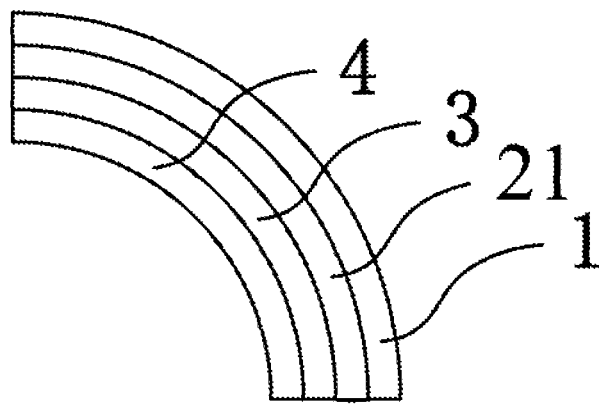
FIG. 1 is a cross-sectional schematic diagram of an OLED curved-surface display panel in the prior art.
Figure 2:
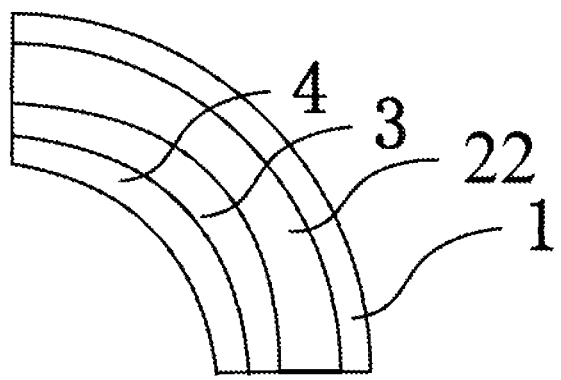
FIG. 2 is a cross-sectional schematic diagram of an OLED curved-surface display panel in an embodiment.

As shown in FIG. 2, an OLED curved-surface display panel in an embodiment is a top-emission OLED display panel, including a second transparent electrode 4, an organic luminescent layer 3, a first transparent electrode 22 and a reflective electrode 1, wherein the second transparent electrode is closer to a display side than the first transparent electrode, and the first transparent electrode 22 trends to get thicker from a middle portion to an edge portion.

To be noted, in the embodiments described herein, the term "display side" means a side of the display panel which can display an image, i.e., a side where the user can view a display image.

To be further noted, the second transparent electrode 4, the organic luminescent layer 3, the first transparent electrode 22 and the reflective electrode 1 may be disposed on a substrate in turn, and all their surfaces may be set as curved.

In the embodiment, the surface of the OLED curved-surface display panel may be bent relative to column pixels located on the central line of the display panel, i.e., when the user directly faces the display panel, the surface of the display panel is bent from the left and right sides of the display panel towards the middle. Other embodiments are also feasible.

Figure 3:
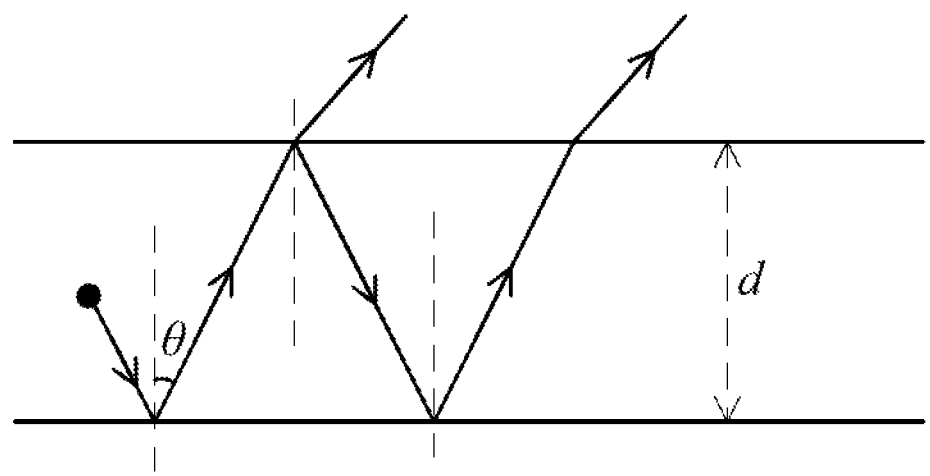
FIG. 3 is a schematic diagram of the display principle of an OLED curved-surface display panel.

As shown in FIG. 3, which is a schematic diagram of the display principle of a top-emission OLED, the following formula is met when light is emergent from a micro-cavity:

$$\lambda j = 2nd \cos \theta \qquad \text{Equation 1}$$

wherein λ is an emergent light wavelength, n is an average refractive index of media in the micro-cavity, d is a microcavity thickness, and θ is a reflection angle. The emergent light wavelength λ is corresponding to the light color, and j is a positive integer. It can be seen that the light color is directly related to the micro-cavity thickness d. In the conventional curved-surface display panel, the micro-cavity thickness at the middle portion is the same as that at the edge portion. However, the light wavelength λ is varied, since the reflection angle θ of the middle portion of the curved-surface display panel is different from that of the edge portion, thus a color cast will be caused. As can be seen from Equation 1, the light color may be adjusted by controlling the microcavity thickness d. In the embodiment, the micro-cavity thickness d at the middle portion and the micro-cavity thickness d of the edge portion of the curved-surface display panel are changed by adjusting the thickness of the first transparent electrode 22 (e.g., made of indium tin oxide ITO), so as to adjust the light color, thereby decreasing the color difference between the middle portion and the edge portion.

In this embodiment, a variation range of the thickness from the middle portion to the edge portion of the first transparent electrode 22 may be 10 nm to 150 nm.

Figure 4:
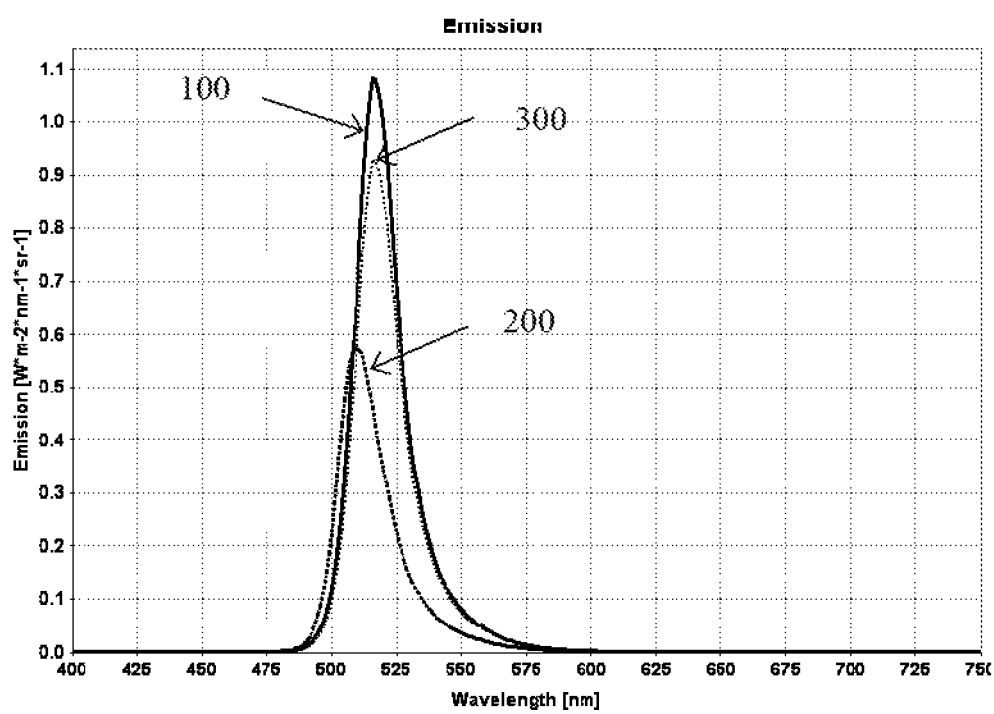
FIG. 4 is a curve chart of a test of reducing a color difference between a center and an edge of the OLED curved-surface display panel in FIG. 2.

As shown in FIG. 4, which is a curve chart of a test of reducing a color difference of an OLED curved-surface display panel in an example embodiment, green light is taken as an example.

Specifically, Curve 100 in FIG. 4 indicates a visual perception of a middle portion of a curved-surface display simulated when a display panel of the curved-surface display with a thin first transparent electrode (e.g., 10 nm thickness) is viewed directly.

Curve 200 in FIG. 4 indicates a visual perception of an edge portion of a curved-surface display simulated when a display panel of the curved-surface display is side-viewed (e.g., 30 degrees) with the same structure.

As can be seen from FIG. 4, the edge portion of the curved-surface display panel using a first transparent electrode with the same thickness obviously has its brightness decreased relative to the middle portion, and the light color offsets towards the short wavelength.

Curve 300 in FIG. 4 indicates a visual perception of an edge portion of an improved curved-surface display simulated when side-viewed (30 degrees) with the same structure of the organic luminescent layer while using a thick first transparent electrode (e.g., 20 nm thickness). As indicated by Curve 300 of FIG. 4, the brightness difference and the light color difference between the edge portion and the middle portion are obviously decreased.

Figure 5:
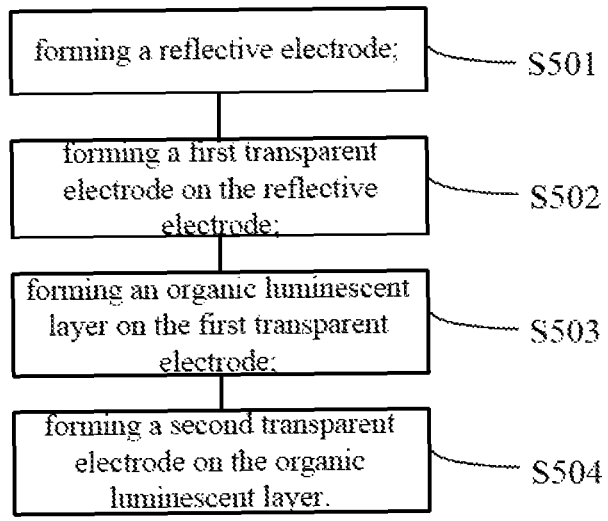
FIG. 5 is a flow chart of a method for manufacturing an OLED curved-surface display panel in an embodiment.

As shown in FIG. 5, the disclosure further provides an example method for manufacturing an OLED curved-surface display panel, the method including:

S501: forming a reflective electrode, wherein the reflective electrode may be formed on a substrate, and the substrate may be a glass substrate or a plastic substrate;

S502: forming a first transparent electrode on the reflective electrode, wherein a thickness of the first transparent electrode is in an increasing tendency from a middle portion to an edge portion;

S503: forming an organic luminescent layer on the first transparent electrode;

S504: forming a second transparent electrode on the organic luminescent layer.

Figure 6:
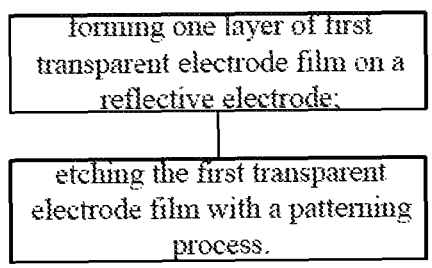
FIG. 6 is a flow chart of a method for forming a first transparent electrode of an OLED curved-surface display panel in an embodiment.

In one example, as shown in FIG. 6, the first transparent electrode may be formed in a method as follows: firstly, forming one layer of first transparent electrode film on a reflective electrode, and then etching the first transparent electrode film with a patterning process, so as to form a first transparent electrode comprising N thickness areas having different thicknesses.

Wherein N≥2 and is a natural number, the thickness areas each include two sub-thickness areas symmetrical with respect to a central line of the first transparent electrode film, i.e., there are an even number of sub-thickness areas in total, or, a thickness area at the center has one sub-thickness area, while other thickness areas each include two sub-thickness areas symmetrical with respect to the central line of the first transparent electrode film, i.e., there are an odd number of sub-thickness areas in total.

To be noted, for the sake of convenience, the serial numbers of the thickness areas in turn increase from the middle portion to the edge portions at both sides in the example embodiment. For example, when the first transparent electrode layer includes four thickness areas and seven sub-thickness areas (the thickness area at the center only includes one sub-thickness area), one sub-thickness area at the right center is the first sub-thickness area, and two sub-thickness areas at the outermost edges of the two sides are the fourth sub-thickness areas.

Figure 7:
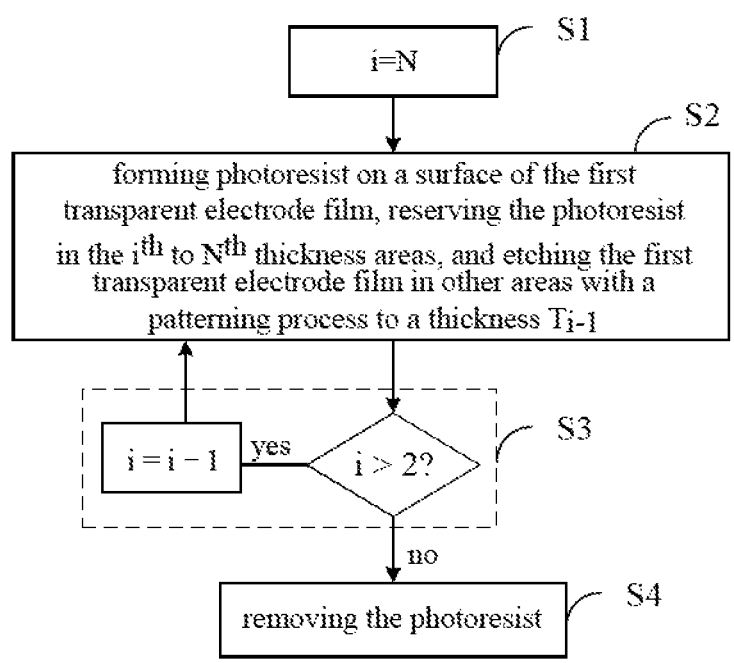
FIG. 7 is a flow chart of a method for forming a first transparent electrode with a patterning process in an embodiment.

In a further example, in order to simplify the process, the first transparent electrode film may be formed in the same thickness as that required by the edge of the first transparent electrode, thus the edge portion of the first transparent electrode film does not need to be etched during patterning. In the example embodiment, the thickness corresponding to the $i^{th}$ thickness area among N thickness areas is $T_i$, wherein i=1, 2, 3, . . . , N. As shown in FIG. 7, forming N thickness areas having different thicknesses by etching the first transparent electrode film with a patterning process specifically may include the steps of:

S1: i=N;

S2: forming photoresist on a surface of the first transparent electrode film by forming the photoresist only in the ith to Nth thickness areas, and etching the first transparent electrode film in other areas with a patterning process to a thickness Ti−1;

S3: if i>2, i=i−1, and repeating step S2, so that the finally formed first transparent electrode trends to get thicker from the middle portion to the edge portion, wherein $T_i>T_{i-1}$, and the $i^{th}$ thickness area is closer to the edge than the $i-1^{th}$ thickness area;

S4: removing the photoresist, i.e., removing the photoresist formed in multiple times at one time.

As can be seen from the above manufacturing procedure, the process is more complex as the value of N increases, while the formed curved surface is smoother. The value of N may be selected upon actual conditions in the manufacturing procedure, so that the curved surface is relatively smooth in case of a relatively simple process. In one embodiment, it may be selected that N=3, i.e., in case of a simple manufacturing process, the first transparent electrode includes three thickness areas, thereby decreasing the color difference between the middle and the edge at certain extent, relative to the curved-surface display panel with a first transparent electrode having the same thickness.

In one embodiment, the value of N is not more than a half of the number of columns of pixels of the display panel, so as to simplify the manufacturing procedure without degrading the display effect.

The curved surface of the curved-surface display panel in the embodiments described herein may be shaped as a part of a cylindrical surface.

In one embodiment, the increasing amplitude of the thickness of the first transparent electrode may be raised while the distance to the edge of the display panel is decreased. Since the viewing angle increases with the decrease of the distance to the edge, the reflection angle θ increases and cos θ decreases in formula (1), thus λ can remain substantially unchanged by sharply increasing the thickness d, so as to further reduce the color difference between the edge and the middle of the curved-surface display panel.

In one specific embodiment, the number of columns of pixels covered by the $i^{th}$ thickness area is larger than the number of columns of pixels covered by the $i-1^{th}$ thickness area, i.e., the number of columns of pixels covered by the thickness area close to the edge portion of the first transparent electrode is larger than the number of columns of pixels covered by the thickness area close to the middle portion of the first transparent electrode; or, the number of rows of pixels covered by the $i^{th}$ thickness area is larger than the number of rows of pixels covered by the $i-1^{th}$ thickness area, i.e., the number of rows of pixels covered by the thickness area close to the edge portion of the first transparent electrode is larger than the number of rows of pixels covered by the thickness area close to the middle portion of the first transparent electrode.

In addition, the disclosure further provides a display device including any of the above curved-surface display panels. The display device may be any product or part having a display function, such as cellular phone, tablet PC, television, display, notebook computer, digital camera, and navigator.

To be noted, the terms "first" and "second" are only used for the purpose of description, rather than indicating or implying any relative importance.

The drawings could exaggerate the sizes of the layers and areas for clear illustrations, and the similar reference signs denote the similar elements throughout the descriptions.

In addition, it should be understood that when an element or layer is referred to as being "above" or "on" another element or layer, it may be directly located on other element, or there may be an intermediate layer; when an element or layer is referred to as being "below" or "under" another element or layer, it may be directly located under other element, or there may be more than one intermediate layer or element; and when an element or layer is referred to as being "between" two layers or elements, it may be an unique layer between the two layers or elements, or there may be more than one intermediate layer or element.

The above embodiments are merely used to describe the disclosure, rather than limiting the disclosure. Those skilled in the art may further make various variations and modifications without departing from the spirit and scope of the present invention. Thus, any equivalent technical solution is also covered by the disclosure, and the patent protection scope of the disclosure is determined by the claims.

What is claimed is:

1. An OLED curved-surface display panel comprising:
a first transparent electrode;
an organic luminescent layer;
a second transparent electrode; and
a reflective electrode, wherein the second transparent electrode is closer to a display side than the first transparent electrode, and wherein a thickness of the first transparent electrode increases from a middle portion of the curved-surface display to an edge portion of the curved-surface display.

2. The OLED curved-surface display panel according to claim 1, wherein the thickness of the first transparent electrode from the middle portion to the edge portion ranges from 10 nm to 150 nm.

3. The OLED curved-surface display panel according to claim 1, wherein a rate at which the thickness of the first transparent electrode increases gradually rises from the middle portion to the edge portion.

4. The OLED curved-surface display panel according to claim 1, wherein the first transparent electrode comprises a plurality of thickness areas formed in a patterning process, and wherein a first thickness area at the middle portion is thinner than a second thickness area at the edge portion.

5. The OLED curved-surface display panel according to claim 4, wherein the number of pixel columns included in a thickness area close to the edge portion is larger than a number of pixel columns included in a thickness area close to the middle portion.

6. The OLED curved-surface display panel according to claim 4, wherein the number of pixel rows included in a thickness area close to the edge portion of the first transparent electrode is larger than a number of pixel rows included in a thickness area close to the middle portion.

7. A display device comprising the OLED curved-surface display panel according to claim 1.

8. The display device according to claim 7, wherein the thickness of the first transparent electrode from the middle portion to the edge portion ranges from 10 nm to 150 nm.

9. The display device according to claim 7, wherein a rate at which the thickness of the first transparent electrode increases gradually rises from the middle portion to the edge portion.

10. A method for manufacturing an OLED curved-surface display panel, the method comprising:
   forming a reflective electrode, a first transparent electrode, an organic luminescent layer, and a second transparent electrode, wherein a thickness of the first transparent electrode increases from a middle portion of the curved-surface display to an edge portion of the curved-surface display.

11. The method for manufacturing an OLED curved-surface display panel according to claim 10, wherein forming the first transparent electrode comprises:
   forming a first transparent electrode film;
   etching the first transparent electrode film with a patterning process to form a first transparent electrode that includes N thickness areas each having different thicknesses, wherein:
   N≥2 and is a natural number; and
   i) each thickness area includes two sub-thickness areas that are symmetrical with respect to a central line of the first transparent electrode film; or
   ii) a thickness area at a center of the first transparent electrode film includes one sub-thickness area, and the remaining thickness areas each include two sub-thickness areas that are symmetrical with respect to the central line of the first transparent electrode film.

12. The method for manufacturing an OLED curved-surface display panel according to claim 11, wherein a thickness corresponding to an $i^{th}$ thickness area among the N thickness areas is $T_i$, i=1, 2, 3, ..., N, and wherein etching the first transparent electrode film with a patterning process to form the first transparent electrode comprises:
   a) setting i=N;
   b) forming a photoresist on a surface of the first transparent electrode film by applying the photoresist in only the $i^{th}$ to $N^{th}$ thickness areas, and etching the first transparent electrode film in the remaining thickness areas with the patterning process to a thickness $T_{i-1}$;
   c) if i>2, setting i=i−1 and repeating step b) such that the finally formed first transparent electrode increases in thickness from the middle portion to the edge portion, wherein $T_i > T_{i-1}$, and wherein the $i^{th}$ thickness area is closer to the edge than the i−$1^{th}$ thickness area; and
   d) if i≤2, removing the photoresist.

13. The method for manufacturing an OLED curved-surface display panel according to claim 11, wherein N is equal to 3.

14. The method for manufacturing an OLED curved-surface display panel according to claim 11, wherein N is not more than a half of a number of pixel columns of the display panel.

15. The method for manufacturing an OLED curved-surface display panel according to claim 11, wherein a number of pixel columns included in an $i^{th}$ thickness area is larger than a number of columns of pixel columns included in an i−$1^{th}$ thickness area for i=1, 2, 3, ..., N.

16. The method for manufacturing an OLED curved-surface display panel according to claim 11, wherein a number of pixel rows included in an $i^{th}$ thickness area is larger than a number of pixel rows included in an i−$1^{th}$ thickness area for i=1, 2, 3, ..., N.

* * * * *